United States Patent
Kuwako et al.

(10) Patent No.: US 6,693,793 B2
(45) Date of Patent: Feb. 17, 2004

(54) DOUBLE-SIDED COPPER CLAD LAMINATE FOR CAPACITOR LAYER FORMATION AND ITS MANUFACTURING METHOD

(75) Inventors: Fujio Kuwako, Ageo (JP); Kazuhiro Yamazaki, Ageo (JP); Toshifumi Matsushima, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 09/981,296

(22) Filed: Oct. 15, 2001

(65) Prior Publication Data

US 2003/0072129 A1 Apr. 17, 2003

(51) Int. Cl.⁷ .............................. H01G 4/08; H01G 4/30
(52) U.S. Cl. .................. 361/323; 361/305; 361/301.4; 29/25.42
(58) Field of Search ............................... 361/303–305, 361/306.1, 306.2, 306.3, 311, 312, 313, 323; 29/25.42

(56) References Cited

U.S. PATENT DOCUMENTS

| | | | |
|---|---|---|---|
| 4,901,199 A | 2/1990 | Foster | 361/308 |
| 5,079,069 A | 1/1992 | Howard et al. | 428/209 |
| 5,155,655 A | 10/1992 | Howard et al. | 361/303 |
| 5,161,086 A | 11/1992 | Howard et al. | 361/321 |
| 5,185,689 A | 2/1993 | Maniar | 361/313 |
| 5,439,541 A | 8/1995 | Economy | 156/182 |
| 5,626,906 A | 5/1997 | Summerfelt et al. | 427/126.3 |
| 5,655,209 A | 8/1997 | Casey et al. | 419/10 |
| 5,679,230 A * | 10/1997 | Fatcheric et al. | 205/50 |
| 5,707,782 A | 1/1998 | Economy et al. | 430/285.1 |
| 5,742,471 A | 4/1998 | Barbee, Jr. et al. | 361/312 |
| 5,800,575 A * | 9/1998 | Lucas | 29/25.42 |
| 6,068,782 A | 5/2000 | Brandt et al. | 216/17 |

\* cited by examiner

*Primary Examiner*—Dean A. Reichard
*Assistant Examiner*—Eric Thomas
(74) *Attorney, Agent, or Firm*—Roberts & Roberts, LLP

(57) ABSTRACT

The invention concerns multilayered structures useful for forming capacitors, which may be embedded within printed circuit boards or other microelectronic devices. The capacitor comprises a pair of parallel conductive foils separated by a pair of dielectric layers. The dielectric layers are further separated by a heat resistant film layer such that the capacitor exhibits excellent short circuit resistance. The resulting capacitor exhibits excellent void and electrical short resistance.

38 Claims, 2 Drawing Sheets

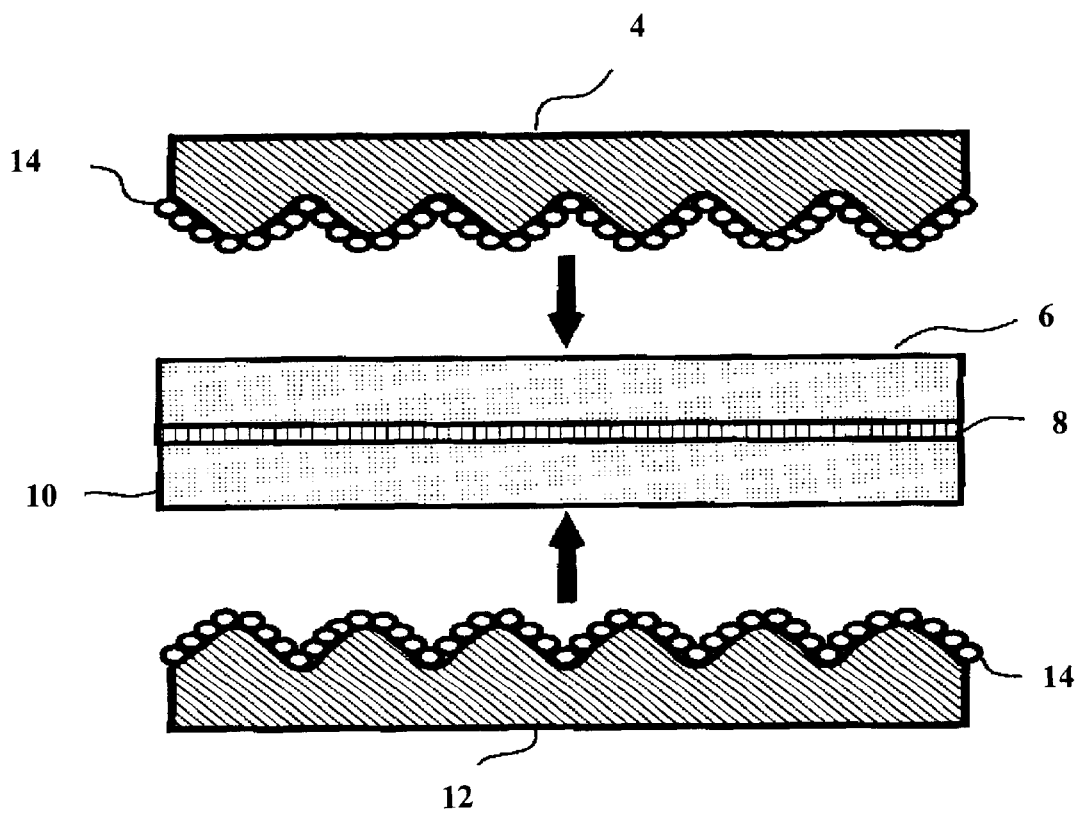
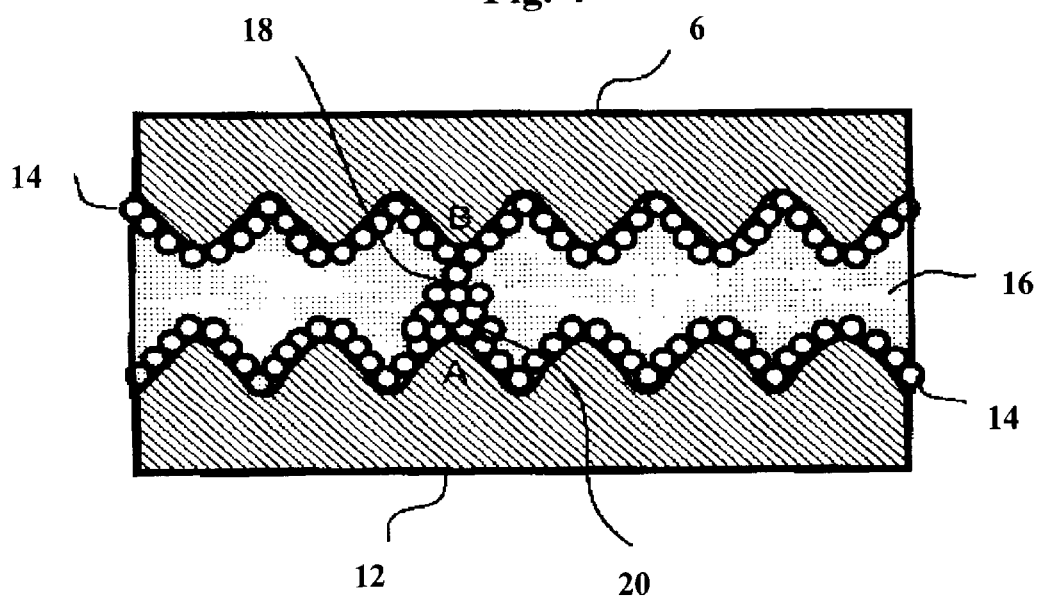

DOUBLE-SIDED COPPER CLAD LAMINATE FOR CAPACITOR LAYER FORMATION AND ITS MANUFACTURING METHOD

BACKGROUND OF THE INVENTION

1. Field of the Invention

This invention relates to multilayered structures useful for forming capacitors. More particularly, the invention pertains to polymeric capacitors, which may be embedded within printed circuit boards or other microelectronic devices. The capacitor comprises a pair of parallel conductive foils separated by a pair of dielectric layers. The dielectric layers are separated by a heat resistant film layer such that the capacitor exhibits excellent short circuit resistance.

2. Description of the Related Art

The operational speed of computers has rapidly increased as a result of improvements in the production of microelectronic devices. As the clock speed of the personal computer exceeds GHz levels, increased device signal transmission speed is required. This is particularly true as local area networks (LAN) are more widely used. In-house LAN systems have become more common due to the need for management of multiple connected computers. This is because LANs provide a very large memory, which can control a vast amount of information. High-speed operational performance also enables several computers to access data simultaneously. As the circuitry design of central processing units (CPU) seeks to achieve these system requirements, the performance of integrated circuits becomes ever more important. The signal transmission function in the server must be fast and have few malfunctions. However, the circuitry design of printed circuit boards, which mount these integrated circuits, is also very important.

Capacitors are common elements on printed circuit boards and other microelectronic devices. Capacitors are used to steady the operational power supply of such devices. A capacitor is a device used for introducing capacitance into a circuit, and functions primarily to store electrical energy, block the flow of direct current, or permit the flow of alternating current. They comprise a dielectric material sandwiched between two electrically conductive metal layers, such as copper foils. In general, the dielectric material is coupled to the electrically conductive metal layers via an adhesive layer, by lamination, or by vapor deposition.

Heretofore, capacitors arranged on the surface of printed circuit boards have been common. However, more recently, capacitors are formed of a thin, double-sided copper clad laminate within multilayered circuit board layers thus producing excellent characteristics. Of these options, it has been preferred to form printed circuit boards having embedded capacitors to maximize the surface area of the circuit board for other purposes. In order to achieve increased signal transmission speed, printed circuit board manufacturers generally form printed circuit boards within such a multilayer structure. The capacitance of a capacitor depends primarily on the shape and size of the capacitor layers and the dielectric constant of the insulating material. There are various known types of dielectric materials known in the art. For example, the dielectric material may be a gas, such as air, a vacuum, a liquid, a solid or a combination thereof. Each material has its own particular properties.

In forming capacitors for use in printed circuit boards, a dielectric material such as a glass reinforced polymer matrix has been used. However, the performance of capacitors of this type has been limited by factors such as limited minimum thickness of the dielectric material, which detracts from the flexibility of the capacitor, the attainable capacitance, the effect of bond enhancers on the metal foils, low dielectric constant and poor dielectric strength.

It is desirable to form a capacitor for circuit boards having a high dielectric constant and an extremely thin layer of dielectric material, thus increasing the capacitance and flexibility of the capacitor. To optimize the performance of a capacitor, it is important that the dielectric material employed have good material properties, exhibiting such qualities as superior adhesion, high dielectric strength and good flexibility. However, common problems frequently associated with extremely thin dielectric layers are the formation of microscopic voids or other structural defects and inclusion of foreign material. These lead to electrical shorts. For example, U.S. Pat. Nos. 5,155,655 and 5,161,086 describe a method for forming a capacitor wherein a single sheet of a dielectric material is laminated together with two conductive foils. Dielectric layers of this type are highly vulnerable to the formation of voids, as well as the inclusion of foreign material, and are time consuming to detect and remedy.

The present invention provides a capacitor that solves the problems of the prior art. The capacitors of the present invention comprise a pair of conductive foils, a pair of thin dielectric layers, with one dielectric layer on a surface of each of the foils. The two conductive foils are adhered together such that the dielectric layers are attached to one another via an intermediate heat resistant film layer.

By using two thin dielectric layers, any structural voids present in one of the individual dielectric is covered when the other dielectric is adjoined. The likelihood that each of the two dielectric layers has a void congruent with a void on the other dielectric layer is extremely remote. This increases the reliability and physical strength of the capacitor and eliminates a source of manufacturing flaws. Also, the thin dielectric layers allow for higher capacitance, greater heat conductivity and greater flexibility of the capacitor. The intermediate heat resistant film layer deters the formation of electrical shorts between the electrically conductive foils. Together, these layers offer a significant improvement in performance over prior art capacitors and printed circuit boards.

SUMMARY OF THE INVENTION

The invention provides a multilayered construction suitable for forming capacitors which comprises sequentially attached layers comprising: a first electrically conductive layer, a first thermosetting polymer layer, a heat resistant film layer, a second thermosetting polymer layer and a second electrically conductive layer.

The invention also provides a capacitor which comprises sequentially attached layers comprising: a first electrically conductive layer, a first thermosetting polymer layer, a heat resistant film layer, a second thermosetting polymer layer and a second electrically conductive layer.

The invention still further provides a method of forming a multilayered construction for forming capacitors, which comprises sequentially attaching layers comprising a first electrically conductive layer, a first thermosetting polymer layer, a heat resistant film layer, a second thermosetting polymer layer and a second electrically conductive layer.

The invention still further provides a method of forming a multilayered construction for forming capacitors which comprises attaching a first thermosetting polymer layer to a surface of a first electrically conductive layer; attaching a second thermosetting polymer layer to surface of a second electrically conductive layer; and then laminating the first and second thermosetting polymer layers to opposite surfaces of a heat resistant film layer.

The invention also provides a method of forming a multilayered construction for forming capacitors which comprises attaching a first thermosetting polymer layer to a first surface of a heat resistant film layer; attaching a second thermosetting polymer layer to a second opposite surface of the heat resistant film layer; applying a first electrically conductive layer to the first thermosetting polymer layer and applying a second electrically conductive layer to the second thermosetting polymer layer.

BRIEF DESCRIPTION OF THE DRAWINGS

FIG. 3 is a schematic representation of one technique for forming a multilayered construction of FIG. 1, wherein a thermosetting polymer layer is first applied onto opposite sides of a heat resistant film layer and then an inner surface of two conductive layers are attached to the thermosetting polymer layers.

FIG. 4 is a schematic representation of a prior art technique for forming a multilayered capacitor in which there is no heat resistant film layer. An electrical short is formed between opposite conductive layer across an intermediate thermosetting polymer layer.

DETAILED DESCRIPTION OF THE PREFERRED EMBODIMENTS

Figure 1:
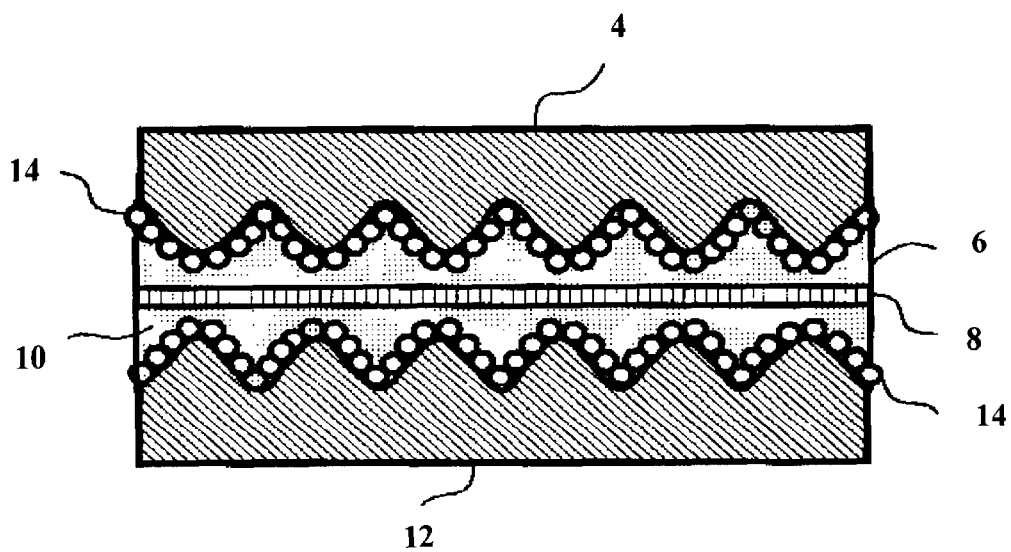
FIG. 1 is a schematic representation of a multilayered construction according to the invention, which has outer electrically conductive layers having anchor nodules on their inner surfaces, a thermosetting polymer layer on an inner surface of each conductive layer and a heat resistant film layer between the thermosetting polymer layers.

The invention provides a multilayered construction suitable for forming a capacitor. As shown in FIG. 1, the multilayered construction 2 comprises a sequentially attached layers comprising a first electrically conductive layer or foil 4, a first thermosetting polymer layer 6, a heat resistant film layer 8, a second thermosetting polymer layer 10 and a second electrically conductive layer or foil 12. The first and second dielectric layers 6, 10 may be the same or a different material, and the first and second conductive layers or foils 4, 12 may be the same or a different material. In a preferred embodiment, the multilayered construction 2 is a capacitor.

Figure 2:
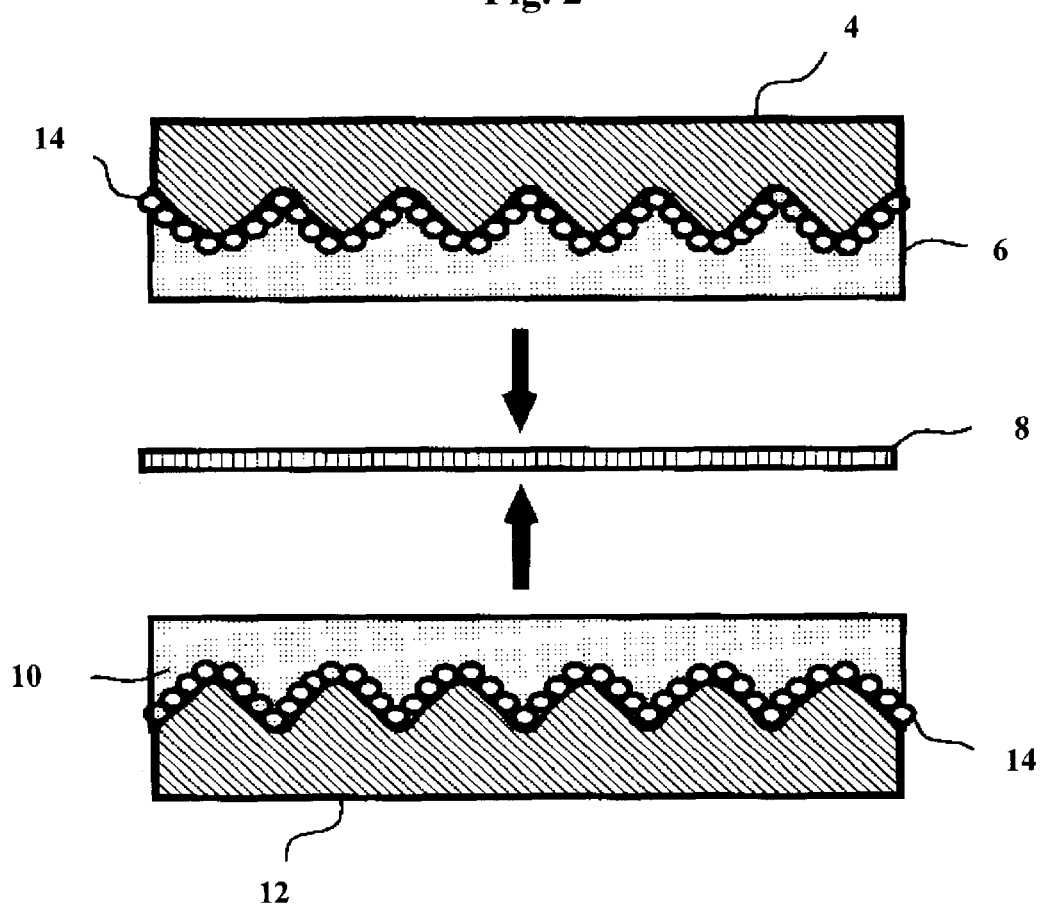
FIG. 2 is a schematic representation of one technique for forming a multilayered construction of FIG. 1, wherein a thermosetting polymer layer is first applied onto an inner surface of each conductive layer and then the thermosetting polymer layers are attached to opposite sides of a heat resistant film layer.

FIG. 2 shows one method of producing the multilayered construction wherein the first thermosetting polymer layer 6 is first attached to a surface of the first electrically conductive layer or foil 4; the second thermosetting polymer layer 10 is attached to a surface of the second electrically conductive layer or foil 12; and then the first and second thermosetting polymer layers 6, 10 are attached to opposite sides of the heat resistant film layer 8. For purposes of this invention, attaching means any method of appending one layer to the next layer, non-exclusively including coating, laminating, sputtering, vapor depositing, electrodeposition, plating, or evaporating, either simultaneously or sequentially. The first and second thermosetting polymer layers 6, 10 form a substantially uniform layer on a complete surface of its corresponding first or second electrically conductive layer or foil 4, 12 and form a substantially uniform layer on a complete surface of the heat resistant film layer 8.

FIG. 3 shows another one method of producing the multilayered construction wherein the first and second thermosetting polymer layers 6, 10 are first attached to opposite sides of the heat resistant film layer 8. Then a surface of the first thermosetting polymer layer 6 is attached to a surface of the first electrically conductive layer or foil 4; and a surface of the second electrically conductive layer or foil 12 is attached to a surface of the second thermosetting polymer layer 10.

One technique by which the multilayered constructions of this invention may be produced is by applying a thermosetting polymer layer onto a surface of the conductive layer or foil 4, 12 or the heat resistant film layer 8 wherein the liquid dielectric layer comprises a thermosetting polymer and a solvent. Such coating may be done by unwinding web of conductive foil or heat resistant film from a roll and then applying a continuous layer of the dielectric material onto a surface of the conductive foil or heat resistant film. A metering device such as a doctor blade, slot-die, reverse roll or other may regulate the thickness of the dielectric layer. If the thermosetting polymers are prepared without a solvent, application techniques include vapor deposition or sputtering in the case the dielectric can be easily vaporized and re-condensed. In another technique, a self-standing thermosetting polymer layer or film may be adhered or laminated onto a surface of the conductive layer or foil 4, 12 or the heat resistant film layer 8. One or both of the first thermosetting polymer layer and the second thermosetting polymer layer may be only partially cured prior to the attaching to the adjacent layers.

In the case of foils prepared by electrodeposition, where one of the surfaces has a matte finish and the opposing side a shiny finish, the thermosetting polymer layers 6, 10 may be applied onto either the shiny or matte surface of the foil. In the case where a stronger bond between a dielectric layer and the conductive foil is desired, the thermosetting polymer layers 6, 10 may be applied to the matte side of the conductive layer or foil 4, 12. The conductive layer or foil can be mechanically or chemically treated to provide a more active surface to enhance the bond strength. In the case where a lower profile (less rough) surface is desired, the shiny surface of the conductive layer or foil can be used. This side can also be mechanically or chemically treated to provide a more active surface to enhance the bond strength.

After attaching the individual layers, the multilayered construction may optionally be placed into an oven to evaporate residual solvent(s) from the thermosetting polymer and either partially or fully cure the thermosetting polymer layer. Such procedure may be done by subjecting the multilayered construction to a temperature of from about 38° C. (100° F.) to about 316° C. (600° F.), for about 1 to about 120 minutes. The thermosetting polymer layers may be fully or partially cured depending on the manufacturing process of the capacitor. After the desired degree of cure is completed, the multilayered construction is removed from the oven and cooled.

The thermosetting polymer layers may be also applied to the conductive foils or heat resistant film layer in the form of solid sheets. In one embodiment, a first solid thermosetting polymer layer is laminated onto a surface of a first conductive foil, a second solid thermosetting polymer layer is then laminated onto a second conductive foil, and then the first and second thermosetting polymer layers are laminated to opposite side of the heat resistant film layer. Alternatively, a first conductive foil, a first solid thermosetting polymer sheet, a heat resistant film layer, a second solid thermosetting polymer sheet, and a second conductive foil are sandwiched together and simultaneously or sequentially laminated under heat and pressure. Lamination may be conducted in a press at a temperature of from about 150° C. to about 310° C., more preferably from about 160° C. to about 200° C. Lamination may be conducted for from about 30 minute to about 120 minutes, preferably from about 40 minutes to about 80 minutes. Preferably, the press is under a vacuum of at least 70 cm (28 inches) of mercury, and maintained at a pressure of about from about 3.5 kgf/cm$^2$ (50 psi) to about 28 kgf/cm$^2$ (400 psi), preferably from about 4.9 kgf/cm$^2$ (70 psi) to about 14 kgf/cm$^2$ (200 psi).

Each conductive foil or layer may comprise either the same metal or may comprise different metals. The conductive metals appropriate for the purposes of the present invention may vary depending on the desired application. The conductive foils or layers preferably comprise a material selected from the group consisting of copper, zinc, brass, chrome, nickel, aluminum, stainless steel, iron, gold, silver, titanium and combinations and alloys thereof. Most preferably, the conductive foils and layers comprise a copper. The conductive foils and layers preferably have a thickness of from about 0.5 to about 200 microns, more preferably from about 9 to about 70 microns. The conductive materials used in the capacitors of this invention may be manufactured with a shiny side surface and a matte surface. Examples of such conductive materials are disclosed in U.S. Pat. No. 5,679,230, which is incorporated herein by reference.

The electrically conductive layers may be provided with a bond enhancing treatment on one or both sides. One or both sides of the metal foil may optionally be roughened, such as by micro-etching, by being electrolytically treated to form a roughened copper deposit, and/or by being electrolytically treated with a deposition of micro-nodules of a metal or metal alloy on or in the surface. Such include a treatment with nickel, chromium, chromates, zinc, and a silane coupling agent or combinations thereof. FIGS. 1–3 show the electrically conductive layers provided with minute nodules 14, which may comprise the same, or a different metal as the electrically conductive layers. These nodules are preferably copper or a copper alloy, and increase adhesion to the polymer film. Such nodules may be applied according to a technique described in U.S. Pat. No. 5,679,230, which is incorporated herein by reference.

The surface microstructure of the foil may be measured by a profilometer, such as a Perthometer model M4P or S5P, which is commercially available from Mahr Feinpruef Corporation of Cincinnati, Ohio. Topography measurements of the surface grain structure of peaks and valleys are made according to industry standard IPC-TM-650 Section 2.2.17 of the Institute for Interconnecting and Packaging Circuits of 2115 Sanders Road, Northbrook, Ill. 60062. The surface treatments are carried out to produce a surface structure having peaks and valleys which produce roughness parameters wherein the arithmetic average roughness (Ra) ranges from about 0.2 to about 1 microns and the ten point height of irregularities according to ISO 64287-1 (Rz) may ranges from about 0.5 $\mu$m to about 5 $\mu$m.

The first thermosetting polymer layer and the second thermosetting polymer layers may independently comprise an epoxy, a combination of epoxy and a material which polymerizes with an epoxy, a melamine, an unsaturated polyester, a urethane, alkyd, a bis-maleimide triazine, a polyimide, an ester, an allylated polyphenylene ether (or allyl-polyphenylene ether) or combinations thereof. The dry, solid thermosetting polymer layers may comprise about 100% of any of the above compounds or may comprise mixtures of these or may contain other additives. Other acceptable materials include aromatic thermosetting co-polyesters such as those described in U.S. Pat. Nos. 5,439,541 and 5,707,782. Of these materials, the most preferred dielectric is an epoxy having a glass transition temperature (Tg) from about 100° C. to about 250° C., preferably from about 150° C. to about 200° C.

The thermosetting polymer layers may also optionally comprise a filler material. Preferred fillers non-exclusively include powdered ferroelectric materials, barium titanate (BaTiO$_3$), boron nitride, aluminum oxide, strontium titanate, barium strontium titanate, and other ceramic fillers and combinations thereof. If incorporated, a filler is preferably present in the thermosetting polymer layers in an amount of from about 5% to about 80% by volume of the layer, more preferably from about 10% to about 50% by volume of the layer. Preferably at least one of the first thermosetting polymer layer, the heat resistant film layer, and the second thermosetting polymer layer comprises such a powdered filler having a dielectric constant of about 10 or higher. In addition, either one or both of the thermosetting polymer layers may contain a dye or pigment to impart color, alter dielectric opacity or affect contrast.

The thermosetting polymer layers are preferably applied to the conductive foils or heat resistant film layer as liquid polymer solutions to allow for control and uniformity of the polymer thickness. The solution will typically have a viscosity ranging from about 50 to about 35,000 centipoise with a preferred viscosity in the range of 100 to 27,000 centipoise. The polymer solution will include from about 10 to about 80% and preferably 15 to 60 wt % polymer with the remaining portion of the solution comprising one or more solvents. Useful solvents include acetone, methyl-ethyl ketone, N-methyl pyrrolidone, N, N dimethylformamide, N, N dimethylacetamide and mixtures thereof. A most preferred single solvent is methyl-ethyl ketone.

Preferably, the thermosetting polymer layers have a thickness of from about 2 to about 200 microns, more preferably from about 2 to about 100 microns. Preferably the thermosetting polymer layers have a dielectric strength of at least about 19,685 volts/mm (500 volts/mil) thickness.

The heat resistant film layer preferably comprises a polyethylene terephthalate, a polyethylene naphthalate, a polyvinyl carbazole, a polyphenylene sulfide, an aromatic polyamide, a polyimide, a polyamide-polyimide, a polyether nitrile, a polyether-ether-ketone, or combinations thereof. It has a preferred thickness of about 12.5 $\mu$m or less. The combined thickness of the first thermosetting polymer layer, the heat resistant film layer, and the second thermosetting polymer layer is about 25 $\mu$m or less. The heat resistant film layer has a VICAT softening point of about 150° C. or higher as determined by ISO 306. The heat resistant film layer preferably has a Young's modulus of about 300 kgf/mm$^2$ or more, a tensile strength of about 20 kgf/mm$^2$ or more, an elongation of about 5% or more, and a higher softening temperature than the laminating temperature of the first thermosetting polymer layer and the second thermosetting polymer layer. The dielectric constant of each of the first thermosetting polymer layer, the heat resistant film layer, and the second thermosetting polymer layer is about 2.5 or more. The heat resistant film layer preferably has a dielectric breakdown voltage of at least about 50 volts, more preferably at least about 250 volts, and most preferably at least about 500 volts.

Prior to attaching the layers to form the multi-layer structure, the heat resistant film layer may have a bond enhancing treatment which may comprise a plasma treatment, a corona treatment, a chemical treatment or combinations thereof.

The multilayered construction of the invention comprises sequentially attached layers of a first electrically conductive layer, a first thermosetting polymer layer, a heat resistant film layer, a second thermosetting polymer layer and a second electrically conductive layer. By sequentially attached is meant that the layers must be present in the indicated order; however, other intermediate layers may optionally be present between the specified layers. In the preferred embodiment of the invention, the preferred capacitance of the capacitor is at least about 100 pF/cm$^2$, more preferably from about 100 pF/cm$^2$ to about 4,000 pF/cm$^2$. The capacitors of this invention may be used in a variety of printed circuit applications. For example, an electrical connection may be present on the first electrically conductive layer and another electrical connection to the second electrically conductive layer. The capacitor may be connected to or be incorporated into a printed circuit board or other electronic device or the electronic device may comprise a printed circuit board comprising the capacitor. They may be coupled with or embedded within rigid, flexible or in rigid/flexible electrical circuits, printed circuit boards or other microelectronic devices such as chip packages. Generally, they are used by creating a first circuit pattern on the conductive foil layer. A second circuit pattern may be applied to the polymer surface either in the form of a conductive foil, by electrodeposition, by sputtering, by vapor phase deposition or some other means. In addition, it may be necessary to generate vias in the capacitor to electrically connect opposing circuit layers.

Once a capacitor has been formed, circuit patterns may also be created in the conductive foil layer using known etching techniques. In etching, a layer of a photo-imageable resist, dry-film or liquid material is applied to the conductive foil layer. Using a negative photo pattern, which is overlaid on the resist, the photoresist is exposed to actinic radiation such as UV radiation creating a desired circuit pattern. The imaged capacitor is then exposed to film developing chemistry that selectively removes the unwanted unexposed portions. The capacitor with circuit image is then contacted with known chemical etchant baths to remove the exposed conductive layer, leaving the final desired conductive patterned capacitor. Also, each of the conductive layers may optionally be electrically connected by forming a hole through the entire capacitor and filling it with a conductive metal. Lamination steps are preferably conducted at a minimum of 150° C.

As may be seen in FIG. 1, a multilayered construction formed by sequentially attached layers of a first electrically conductive layer, a first thermosetting polymer layer, a heat resistant film layer, a second thermosetting polymer layer and a second electrically conductive layer avoids structural voids which may be present in one of the individual thermosetting polymer. The intermediate heat resistant film layer deters the formation of electrical shorts between the electrically conductive foils and any nodules on the conductor layers surfaces. By way of contrast, FIG. 4 shows prior art opposed electrically conductive foils having surface nodules wherein a single thicker thermosetting polymer layer 16 is positioned between the foils. As one can see, nodules at point A on one conductive foil may form an undesired electrical short with corresponding nodules at point B on an opposite conductive foil. This may occur at short contact point 18 and may be due to abnormally formed nodules at 20. The layering system of the present invention offers a significant improvement in performance over prior art capacitors and printed circuit boards. This construction offers further protection against shorting in subsequent processing steps where customers may laminate additional layers having protruding surface features to the inventive capacitors at very high local pressures.

The following non-limiting examples serve to illustrate the invention.

EXAMPLE 1

A roll of electrodeposited 35 micron, one ounce copper foil, 0.64 meters in width is mounted on an unwind roller. A sample of the foil is taken as a 0.3 m×0.3 m cut and weighed to establish the foil base weight. The foil is threaded through tensioning rollers and into an oven, through idler rollers, and onto a rewind roller. The foil is then tensioned to 0.7 kg per centimeter width. Temperature in the air oven dryer are set at 80° C., 120° C. and 160° C. in three different zones and allowed to stabilize. A drive motor is engaged on the rewind roller and line speed is set to 1.2 meters/minute. Edge guides are enabled and proper tracking through the oven is confirmed. A liquid epoxy resin is adjusted to 30% solids, a viscosity of about 500 centipoises, with MEK in a stainless steel mixing vat.

A doctor blade is adjusted to produce a wet film of 15 microns in thickness, resulting in a flexible composite having a dried polymer film in thickness of about 5 microns. A continuous liquid head height and volume of dammed material is maintained on the upstream side of the doctor blade to maintain a constant flexible composite film thickness and a film free of included air bubbles.

The solvent is evaporated off and the epoxy resin is cured in an oven. As the coated foil first enters the oven, an initial temperature drop should be anticipated. Once steady state temperatures are achieved in the oven, film thickness is checked by taking a foil sample and comparing the coated weight to the base weight of the foil using the epoxy resin density to convert from weight to film thickness. Adjustments to the rate of epoxy resin dispensed and or doctor blade height over the foil are corrected based on this measurement. This process is repeated until the desired film thickness is attained to produce first and second thermosetting polymer layers on first and second copper foil layers. A capacitor is formed by laminating two pieces of this coated foil to an intermediate heat resistant sheet of an aromatic polyamide having a thickness of 4 um, Young's modulus of 1500 kg/mm$^2$, a tensile strength of 40 kg/mm$^2$ and an elongation of about 20% in 25° C. Lamination is done in a hydraulic press at 165° C. and 10 kgf/cm$^2$ (150 psi) for 60 minutes. The press is under vacuum of 71 cm (28 inches) of mercury. The capacitor is cut to size and processed to impart a pattern in the copper. The resulting capacitor is visually inspected and then electrically tested for shorting at 500 volts. Resulting capacitor layers will have a capacitance of at least 300 pF/cm$^2$ and a dielectric breakdown voltage of at least 7.87×10$^4$ volts/mm (2000 volts/mil.).

EXAMPLE 2

Example 1 is repeated except a heat resistant film layer which is a 10-micron sheet of polyethylene terephthalate is laminated between the polymer surfaces of the coated copper. Resulting product has improved dimensional stability and tear resistance.

EXAMPLE 3 (COMPARATIVE)

A thermosetting resin layer of 7 μm in thickness was formed on the bonding side of 35 μm thickness copper foils having minute copper nodules (MLS made by Mitsui Mining and Smelting Co., Ltd.) in the manner described in Example 1. The resin sides of the two resin coated copper foils were directly attached together by hot-press lamination without an intermediate heat resistant sheet, and the double-sided copper clad laminate shown in FIG. 4 was obtained.

A voltage was applied to ten samples of the double-sided copper clad laminate produced by this method and the laminates then electrically tested for shorting at 500 volts according to paragraph 2.5.7 of the IPC-TM-650 standard. As a result, a short-circuit was generated in nine of the ten pieces immediately after energizing. The average of the capacitance at this time was 0.32 nF/cm$^2$, and the average thickness of the resin layer measured by section observation was 9.5 μm. This shorting is believed to be due to an abnormal growth of part of the nodular treated copper foils to a facing surface of copper foil according to an observation of the part where the short-circuit is generated.

A dry film was stuck on both sides of this double-sided copper clad laminate. A circuitry pattern was formed on the capacitors by lithographic exposure and development of an applied photoresist, and circuitry was formed by etching. A tear of the resin layer occurred in all samples.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives, which have been discussed above, and all equivalents thereto.

What is claimed is:

1. A multilayered construction suitable for forming capacitors which comprises sequentially attached layers comprising: a first electrically conductive layer, a first thermosetting polymer layer, a heat resistant film layer, a second thermosetting polymer layer and a second electrically conductive layer.

2. The multilayered construction of claim 1 wherein the electrically conductive layers independently comprise a material selected from the group consisting of copper, zinc, brass, chrome, nickel, aluminum, stainless steel, iron, gold, silver, titanium, platinum and combinations thereof.

3. The multilayered construction of claim 1 wherein the electrically conductive layers comprises copper.

4. The multilayered construction of claim 1 wherein the electrically conductive layers comprise copper foils having a surface roughness Rz in the range of from about 0.5 μm to about 5 μm.

5. The multilayered construction of claim 1 wherein the electrically conductive layers are provided with a bond enhancing treatment on one or both sides thereof.

6. The multilayered construction of claim 1 wherein the electrically conductive layers are provided with a bond enhancing treatment which comprises treatment with metal nodules, nickel, chromium, chromates, zinc, a silane coupling agent or combinations thereof.

7. The multilayered construction of claim 1 wherein the combined thickness of the first thermosetting polymer layer, the heat resistant film layer, and the second thermosetting polymer layer is about 25 μm or less.

8. The multilayered construction of claim 1 wherein the thickness of the heat resistant film layer is about 12.5 μm or less.

9. The multilayered construction of claim 1 wherein one or both of the first thermosetting polymer layer and the second thermosetting polymer layer comprise an epoxy, a melamine, an unsaturated polyester, a urethane, alkyd, a bis-maleimide triazine, a polyimide, an ester, an allyated polyphenylene ether or combinations thereof.

10. The multilayered construction of claim 1 wherein one or both of the first thermosetting polymer layer and the second thermosetting polymer layer comprise an epoxy and a material which polymerizes with an epoxy.

11. The multilayered construction of claim 1 wherein the heat resistant film layer comprises a polyethylene terephthalate, a polyethylene naphthalate, a polyvinyl carbazole, a polyphenylene sulfide, an aromatic polyamide, a polyimide, a polyamide-polyimide, a polyether-nitrile, a polyether-ether-ketone, or combinations thereof.

12. The multilayered construction of claim 1 wherein the heat resistant film layer comprises an aromatic polyamide.

13. The multilayered construction of claim 1 wherein the heat resistant film layer has a VICAT softening point of about 150° C. or higher as determined by ISO 306.

14. The multilayered construction of claim 1 wherein the heat resistant film layer comprises an aromatic polyamide; wherein the electrically conductive layers comprise copper and wherein the first thermosetting polymer layer and the second thermosetting polymer layer comprise an epoxy.

15. The multilayered construction of claim 1 wherein the first thermosetting polymer layer and the second thermosetting polymer layer are attached to the heat resistant film layer by lamination; wherein the heat resistant film layer has a Young's modulus of about 300 kgf/mm$^2$ or more, a tensile strength of about 20 kg/mm$^2$ or more and an elongation of about 5% or more, and a higher softening temperature than the lamination temperature of the first thermosetting polymer layer and the second thermosetting polymer layer to the heat resistant film layer.

16. The multilayered construction of claim 1 wherein the dielectric constant of each of the first thermosetting polymer layer, the heat resistant film layer, and the second thermosetting polymer layer is about 2.5 or more.

17. The multilayered construction of claim 1 wherein at least one of the first thermosetting polymer layer, the heat resistant film layer, and the second thermosetting polymer layer comprises a powdered filler of a ferroelectric material, barium titanate, boron nitride, aluminum oxide, strontium titanate, barium strontium titanate, or other ceramics or combinations thereof.

18. The multilayered construction of claim 1 wherein at least one of the first thermosetting polymer layer, the heat resistant film layer, and the second thermosetting polymer layer comprises a powdered filler having a dielectric constant of about 10 or higher.

19. The multilayered construction of claim 1 which has a dielectric strength of at least about 19,685 volts/mm thickness.

20. The multilayered construction of claim 1 wherein the heat resistant film has a dielectric breakdown voltage of at least about 20 volts.

21. The multilayered construction of claim 1 wherein the heat resistant film has a dielectric breakdown voltage of at least about 250 volts.

22. The multilayered construction of claim 1 wherein the heat resistant film has a dielectric breakdown voltage of at least about 500 volts.

23. A capacitor which comprises sequentially attached layers comprising: a first electrically conductive layer, a first thermosetting polymer layer, a heat resistant film layer, a second thermosetting polymer layer and a second electrically conductive layer.

24. The capacitor of claim 23 further comprising an electrical connection to the first electrically conductive layer and another electrical connection to the second electrically conductive layer.

25. A printed circuit board comprising the capacitor of claim 23.

26. An electronic device comprising the printed circuit board of claim 25.

27. An electronic device comprising the capacitor of claim 23.

28. A method of forming a multilayered construction for forming capacitors which comprises sequentially attaching layers comprising a first electrically conductive layer, a first thermosetting polymer layer, a heat resistant film layer, a second thermosetting polymer layer and a second electrically conductive layer.

29. A method of forming a multilayered construction for forming capacitors which comprises attaching a first thermosetting polymer layer to a surface of a first electrically conductive layer; attaching a second thermosetting polymer layer to surface of a second electrically conductive layer; and then laminating the first and second thermosetting polymer layers to opposite surfaces of a heat resistant film layer.

30. The method of claim 29 wherein one or both of the first thermosetting polymer layer and the second thermosetting polymer layer is only partially cured prior to the laminating step.

31. The method of claim 29 wherein a surface of at least one side of the heat resistant film layer is subjected to a bond enhancing treatment prior to lamination.

32. The method of claim 29 wherein the bond enhancing treatment comprises a plasma treatment, a corona treatment, a chemical treatment or combinations thereof.

33. A method of forming a multilayered construction for forming capacitors which comprises attaching a first thermosetting polymer layer to a first surface of a heat resistant film layer; attaching a second thermosetting polymer layer to a second opposite surface of the heat resistant film layer; applying a first electrically conductive layer to the first thermosetting polymer layer and applying a second electrically conductive layer to the second thermosetting polymer layer.

34. The method of claim 33 wherein the electrically conductive layers are applied to the thermosetting polymer layers by lamination.

35. The method of claim 33 wherein the electrically conductive layers are applied to the thermosetting polymer layers by vapor deposition, sputtering, plating or combinations thereof.

36. The method of claim 33 comprising laminating the first electrically conductive layer to the first thermosetting polymer layer and laminating the second electrically conductive layer to the second thermosetting polymer layer.

37. The method of claim 33 wherein one or both of the first thermosetting polymer layer and the second thermosetting polymer layer is only partially cured prior to the laminating step.

38. The method of claim 33 wherein a surface of at least one side of the heat resistant film layer is subjected to a bond enhancing treatment prior to lamination.

* * * * *